United States Patent
Ranish et al.

(10) Patent No.: US 9,230,837 B2
(45) Date of Patent: *Jan. 5, 2016

(54) MULTIZONE CONTROL OF LAMPS IN A CONICAL LAMPHEAD USING PYROMETERS

(71) Applicant: Applied Materials, Inc., Santa Clara, CA (US)

(72) Inventors: Joseph M. Ranish, San Jose, CA (US); Paul Brillhart, Pleasanton, CA (US); Jose Antonio Marin, San Jose, CA (US); Satheesh Kuppurao, San Jose, CA (US); Balasubramanian Ramachandran, Santa Clara, CA (US); Swaminathan T. Srinivasan, Pleasanton, CA (US); Mehmet Tugrul Samir, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/292,300

(22) Filed: May 30, 2014

(65) Prior Publication Data

US 2014/0273419 A1    Sep. 18, 2014

Related U.S. Application Data

(63) Continuation of application No. 13/796,169, filed on Mar. 12, 2013, now Pat. No. 8,772,055.

(60) Provisional application No. 61/753,002, filed on Jan. 16, 2013, provisional application No. 61/753,305, filed on Jan. 16, 2013.

(51) Int. Cl.
| | | |
|---|---|---|
| H01L 21/00 | (2006.01) |
| H05B 6/66 | (2006.01) |
| B05C 11/00 | (2006.01) |
| H01L 21/67 | (2006.01) |
| H01L 21/02 | (2006.01) |

(52) U.S. Cl.
CPC ...... H01L 21/67248 (2013.01); H01L 21/0262 (2013.01); H01L 21/67115 (2013.01)

(58) Field of Classification Search
USPC .................... 438/795; 118/666, 667; 219/702
See application file for complete search history.

(56) References Cited

U.S. PATENT DOCUMENTS

2004/0185680 A1* 9/2004 Hauf et al. .................... 438/795
2011/0123178 A1* 5/2011 Aderhold et al. ............. 392/416

* cited by examiner

*Primary Examiner* — Karen Kusumakar
(74) *Attorney, Agent, or Firm* — Patterson & Sheridan, LLP

(57) ABSTRACT

A substrate processing apparatus is provided. The substrate processing apparatus includes a vacuum chamber having a dome and a floor. A substrate support is disposed inside the vacuum chamber. A plurality of thermal lamps are arranged in a lamphead and positioned proximate the floor of the vacuum chamber. A reflector is disposed proximate the dome, where the reflector and the dome together define a thermal control space. The substrate processing apparatus further includes a plurality of power supplies coupled to the thermal lamps and a controller for adjusting the power supplies to control a temperature in the vacuum chamber.

20 Claims, 2 Drawing Sheets

MULTIZONE CONTROL OF LAMPS IN A CONICAL LAMPHEAD USING PYROMETERS

CROSS-REFERENCE TO RELATED APPLICATIONS

This application is a continuation application of co-pending U.S. patent application Ser. No. 13/796,169 filed Mar. 12, 2013, which claims benefit of U.S. Provisional Patent Application Ser. No. 61/753,002, filed Jan. 16, 2013 and U.S. Provisional Patent Application Ser. No. 61/753,305, filed Jan. 16, 2013. Each of the aforementioned patent applications is incorporated herein by reference.

FIELD

Methods and apparatus for semiconductor processing are disclosed herein. More specifically, embodiments disclosed herein relate to methods and apparatus for zoned temperature control in an epitaxy process.

BACKGROUND

Epitaxy is a process that is used extensively in semiconductor processing to form very thin material layers on semiconductor substrates. These layers frequently define some of the smallest features of a semiconductor device, and they may have a high quality crystal structure if the electrical properties of crystalline materials are to be controlled. A deposition precursor is normally provided to a processing chamber in which a substrate is disposed. The substrate is then heated to a temperature that favors growth of a material layer having particular properties.

During epitaxy, the films produced usually have very uniform thickness, composition, and structure. Because of variations in local substrate temperature, gas flows, and precursor concentrations, it is quite challenging to form films having uniform and repeatable properties. The processing chamber is normally a vessel capable of maintaining high vacuum, typically below 10 Torr, and heat is normally provided by heat lamps positioned outside the vessel to avoid introducing contaminants. Control of substrate temperature, and therefore of local layer formation conditions, is complicated by thermal absorptions and emissions of chamber components and exposure of sensors and chamber surfaces to film forming conditions inside the processing chamber. There remains a need for an epitaxy chamber with improved temperature control, and methods of operating such a chamber to improve uniformity and repeatability.

SUMMARY

In one embodiment, a substrate processing apparatus is provided. The substrate processing apparatus includes a vacuum chamber having a dome and a floor. A substrate support is disposed inside the vacuum chamber. A plurality of thermal lamps are arranged in a lamphead and positioned proximate the floor of the vacuum chamber. A reflector is disposed proximate the dome, where the reflector and the dome together define a thermal control space. The substrate processing apparatus further includes a plurality of power supplies coupled to the thermal lamps and a controller for adjusting the power supplies to control a temperature in the vacuum chamber.

In another embodiment, a substrate processing apparatus is provided. The substrate processing apparatus includes a vacuum chamber having a dome and a floor. A substrate support is disposed inside the vacuum chamber. A plurality of thermal lamps are arranged in a lamphead and positioned proximate the floor of the vacuum chamber. A reflector is disposed proximate the dome, where the reflector and the dome together define a thermal control space. The substrate processing apparatus further includes a plurality of power supplies coupled to the thermal lamps and a controller for adjusting the power supplies to control a temperature in the vacuum chamber.

In another embodiment, a method of processing a substrate is provided. The method includes disposing the substrate in a chamber having a floor and a dome; heating the substrate by transmitting radiation from a plurality of lamps through the floor; reflecting a radiation emitted by the substrate with a reflector disposed proximate the dome, the reflector and the dome together defining a thermal control space; depositing a layer on the substrate by flowing a precursor gas across the substrate substantially parallel to a surface of the substrate; detecting a first temperature at a first zone of the substrate using a first sensor disposed proximate the floor; detecting a second temperature at a second zone of the substrate using a second sensor disposed proximate the floor; adjusting power to a first portion of the plurality of lamps based on the first temperature; and adjusting power to a second portion of the plurality of lamps based on the second temperature.

BRIEF DESCRIPTION OF THE DRAWINGS

So that the manner in which the above recited features of the embodiments disclosed above can be understood in detail, a more particular description, briefly summarized above, may be had by reference to the following embodiments, some of which are illustrated in the appended drawings. It is to be noted, however, that the appended drawings illustrate only typical embodiments and are therefore not to be considered limiting of its scope to exclude other equally effective embodiments.

DETAILED DESCRIPTION

A chamber capable of zoned temperature control of a substrate while performing an epitaxy process has a processing vessel with an upper portion, a side portion, and a lower portion all made of a material having the capability to maintain its shape when high vacuum is established within the vessel. At least the lower portion is transparent to thermal radiation, and thermal lamps are positioned in a conical lamphead structure coupled to the lower portion of the processing vessel on the outside thereof. Thermal sensors are disposed at various locations inside the processing vessel with means for reducing thermal noise into the sensors and material deposition on the sensors.

Figure 1:
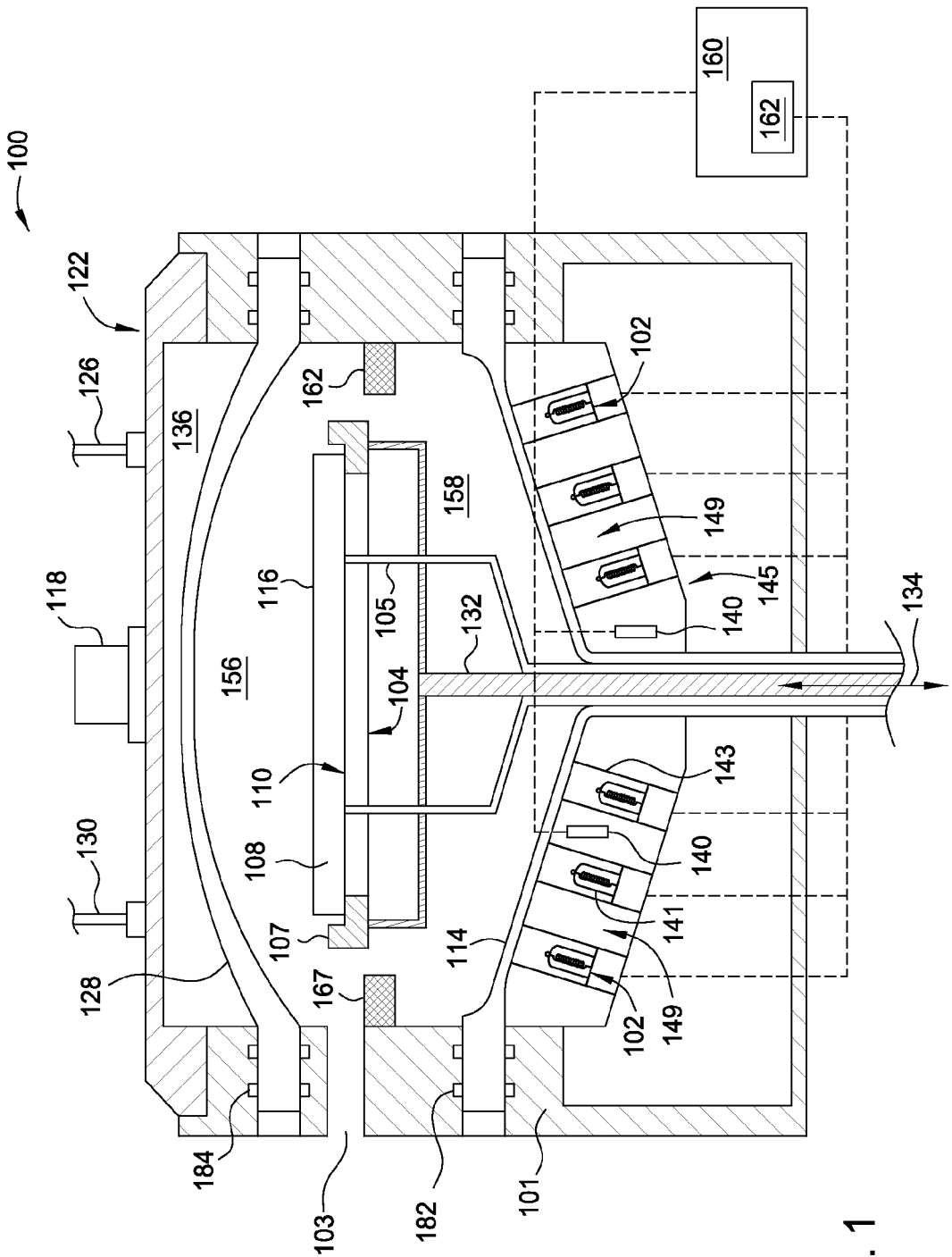
FIG. 1 is a schematic cross-sectional view of a process chamber according to one embodiment.

FIG. 1 is a schematic cross-sectional view of a process chamber 100 according to one embodiment. The process chamber 100 may be used to process one or more substrates, including the deposition of a material on an upper surface of a substrate 108. The process chamber 100 generally includes an array of radiant heating lamps 102 for heating, among other components, a back side 104 of a substrate support 107 disposed within the process chamber 100. The substrate support 107 may be a ring-like substrate support as shown, which supports the substrate from the edge of the substrate, a disk-like or platter-like substrate support, or a plurality of pins, for example three pins. The substrate support 107 is located within the process chamber 100 between an upper dome 128 and a lower dome 114. The upper dome 128 and the lower dome 114 could be secured to a chamber body 101 of the process chamber 100 by fasteners 184, 182 respectively. The substrate 108 (not to scale) can be brought into the process chamber 100 and positioned onto the substrate support 107 through a loading port 103.

The substrate support 107 is shown in an elevated processing position, but may be vertically traversed by an actuator (not shown) to a loading position below the processing position to allow lift pins 105 to contact the lower dome 114, passing through holes in the substrate support 107, and raise the substrate 108 from the substrate support 107. A robot (not shown) may then enter the process chamber 100 to engage and remove the substrate 108 therefrom though the loading port 103. The substrate support 107 then may be actuated up to the processing position to place the substrate 108, with its device side 116 facing up, on a front side 110 of the substrate support 107.

The substrate support 107, while located in the processing position, divides the internal volume of the process chamber 100 into a process gas region 156 (above the substrate) and a purge gas region 158 (below the substrate support 107). The substrate support 107 is rotated during processing by a central shaft 132 to minimize the effect of thermal and process gas flow spatial anomalies within the process chamber 100 and thus facilitate uniform processing of the substrate 108. The substrate support 107 is supported by the central shaft 132, which moves the substrate 108 in an up and down direction 134 during loading and unloading, and in some instances, processing of the substrate 108. The substrate support 107 is typically formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and conduct the radiant energy to the substrate 108. The substrate support 107 is shown in FIG. 1 as a ring with a central opening to facilitate exposure of the substrate to the thermal radiation from the lamps 102. The substrate support 107 may also be a platter-like member with no central opening.

In general, the upper dome 128 and the lower dome 114 are typically formed from an optically transparent material such as quartz. The upper dome 128 and the lower dome 114 are thin to minimize thermal memory, typically having a thickness between about 3 mm and about 10 mm, for example about 4 mm. The upper dome 128 may be thermally controlled by introducing a thermal control fluid, such as a cooling gas, through an inlet portal 126 into a thermal control space 136, and withdrawing the thermal control fluid through an exit portal 130. In some embodiments, a cooling fluid circulating through the thermal control space 136 may reduce deposition on an inner surface of the upper dome 128.

One or more lamps, such as an array of lamps 102, can be disposed adjacent to and beneath the lower dome 114 in a specified manner around the central shaft 132 to heat the substrate 108 as the process gas passes over, thereby facilitating the deposition of a material onto the upper surface of the substrate 108. In various examples, the material deposited onto the substrate 108 may be a group III, group IV, and/or group V material, or may be a material including a group III, group IV, and/or group V dopant. For example, the deposited material may include gallium arsenide, gallium nitride, or aluminum gallium nitride.

The lamps 102 may be adapted to heat the substrate 108 to a temperature within a range of about 200 degrees Celsius to about 1200 degrees Celsius, such as about 300 degrees Celsius to about 950 degrees Celsius. The lamps 102 may include bulbs 141 surrounded by an optional reflector 143. Each lamp 102 is coupled to a power distribution board (not shown) through which power is supplied to each lamp 102. The lamps 102 are positioned within a lamphead 145 which may be cooled during or after processing by, for example, a cooling fluid introduced into channels 149 located between the lamps 102. The lamphead 145 conductively cools the lower dome 114 due in part to the close proximity of the lamphead 145 to the lower dome 114. The lamphead 145 may also cool the lamp walls and walls of the reflectors 143. In some embodiments, the lampheads 145 may or may not be in contact with the lower dome 114.

A circular shield 167 may be optionally disposed around the substrate support 107 and coupled to sidewall of the chamber body 101. The shield 167 prevents or minimizes leakage of heat/light noise from the lamps 102 to the device side 116 of the substrate 108 in addition to providing a preheat zone for the process gases. The shield 167 may be made from CVD SiC coated sintered graphite, grown SiC, or a similar opaque material that is resistant to chemical breakdown by process and cleaning gases.

A reflector 122 may be optionally placed outside the upper dome 128 to reflect infrared light that is radiating off the substrate 108 back onto the substrate 108. Due to the reflected infrared light, the efficiency of the heating will be improved by containing heat that could otherwise escape the process chamber 100. The reflector 122 can be made of a metal such as aluminum or stainless steel. The reflector 122 can have machined channels, such as inlet portal 126 to carry a flow of a fluid such as water for cooling the reflector 122. In some embodiments, the efficiency of the reflection can be improved by coating a reflector area with a highly reflective coating such as with gold.

A plurality of thermal radiation sensors 140, which may be pyrometers, are disposed in the lamphead 145 for measuring thermal emissions of the substrate 108. The sensors 140 are typically disposed at different locations in the lamphead 145 to facilitate viewing different locations of the substrate 108 during processing. Sensing thermal radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. At least two sensors 140 are used, but more than two may be used. Different embodiments may use three, four, five, six, seven, or more sensors 140.

Each sensor 140 views a zone of the substrate 108 and senses the thermal state of a zone of the substrate. The zones may be oriented radially in some embodiments. For example, in embodiments where the substrate 108 is rotated, the sensors 140 may view, or define, a central zone in a central portion of the substrate 108 having a center substantially the same as the center of the substrate 108, with one or more zones surrounding the central zone and concentric therewith. In some embodiments, the zones can be in different arrangements besides concentric and radially oriented. In some embodiments, zones may be arranged at different locations of the substrate 108 in non-radial fashion.

The sensors 140 are typically disposed between the lamps 102, for example in the channels 149, and are usually oriented substantially normal to the substrate 108. In some embodiments the sensors 140 are oriented normal to the substrate 108, while in other embodiments, the sensors 140 may be oriented in slight departure from normality. An orientation angled within about 5° of normal is most frequently used.

The sensors 140 may be attuned to the same wavelength or spectrum, or to different wavelengths or spectra. For example, substrates used in the chamber 100 may be compositionally homogeneous, or they may have domains of different compositions. Using sensors 140 attuned to different wavelengths may allow monitoring of substrate domains having different composition and different emission responses to thermal energy. Typically, the sensors 140 are attuned to infrared wavelengths, for example about 4 µm.

A top thermal sensor 118 may be disposed in the reflector 122 to monitor a thermal state of the upper dome 128 or to monitor the thermal state of the substrate 108 from a viewpoint opposite that of the sensors 140. Such monitoring may be useful to compare to data received from the sensors 140, for example to determine whether a fault exists in the data received from the sensors 140. The top thermal sensor 118 may be an assembly of sensors in some cases, featuring more than one individual sensor. Thus, the chamber 100 may feature one or more sensors disposed to receive radiation emitted from a first side of a substrate and one or more sensors disposed to receive radiation from a second side of the substrate opposite the first side.

A controller 160 receives data from the sensors 140 and separately adjusts power delivered to each lamp 102, or individual groups of lamps or lamp zones, based on the data. The controller 160 may include a power supply 162 that independently powers the various lamps or lamp zones. The controller 160 can be configured with a temperature profile, and based on comparing the data received from the sensors 140, the controller 160 adjusts power to lamps and/or lamp zones to conform the observed thermal data to the temperature profile. The controller 160 may also adjust power to the lamps and/or lamp zones to conform the thermal treatment of one substrate to the thermal treatment of another substrate, in the event chamber performance drifts over time.

Figure 2:
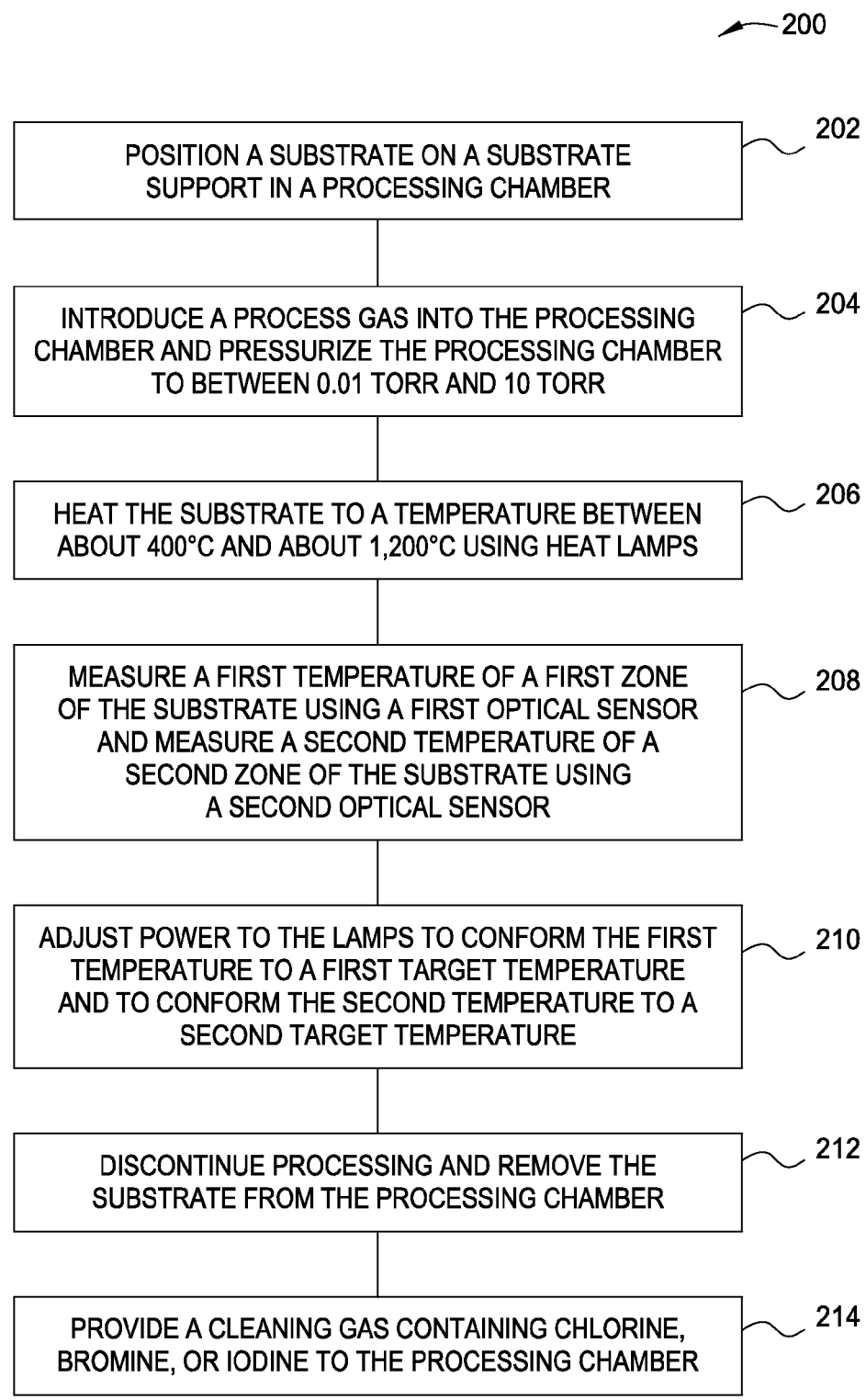
FIG. 2 is a flow diagram summarizing a method according to another embodiment.

FIG. 2 is a flow diagram summarizing a method 200 according to another embodiment. At 202, a substrate is positioned on a substrate support in a process chamber. The substrate support is substantially transparent to thermal radiation and has low thermal mass. Thermal lamps are positioned to provide heat to the substrate.

At 204, a process gas is introduced to the process chamber, and pressure of the process chamber is set between about 0.01 Torr and about 10 Torr. The process gas may be any gas from which a layer is to be formed on the substrate. The process gas may contain a group IV precursor and/or group III and group V precursors, from which a group IV material, such as silicon or germanium, or a group III/V compound material, such as aluminum nitride, may be formed. Mixtures of such precursors may also be used. The process gas is typically flowed with an unreactive diluent or carrier gas, and is typically provided in laminar or quasi-laminar flow substantially parallel to the substrate surface.

At 206, the substrate is heated to a temperature between about 400° C. and about 1,200° C., for example about 600° C. The precursors contact the heated substrate surface and form a layer on the substrate surface. The substrate may be rotated to improve uniformity of film properties.

At 208, a first temperature of a first zone of the substrate is measured by a first optical sensor and a second temperature of a second zone of the substrate is measured by a second optical sensor. The optical sensors may be pyrometers sensing intensity of radiation emitted by the substrate in the first and second zones. In some embodiments, the signals received from the optical sensors may be adjusted to compensate for background radiation emanating from the lamps and reflected from the substrate. The substrate reflectivity as a function of temperature, along with the known intensity of light emitted by the lamps, may be used to model the intensity of reflected light, and the modeled intensity used to adjust the signals from the optical sensors to improve the signal to noise ratio of the sensors.

At 210, power to the lamps is adjusted based on the first temperature and the second temperature readings to conform the first temperature to a first target temperature and to conform the second temperature to a second target temperature. The first and second target temperatures may be the same or different. For example, to compensate for faster film formation at an edge of the substrate than at the center of the substrate, the first temperature may be measured at the center of the substrate, the second temperature may be measured at the edge of the substrate, and lamp power adjusted to provide a higher substrate temperature at the center than at the edge of the substrate. In some embodiments, more than two zones may be used to monitor temperatures at more than two locations on the substrate to increase the specificity of local temperature control.

At 212, processing is stopped and the substrate is removed from the process chamber. At 214, a cleaning gas is provided to the chamber to remove deposits from chamber surfaces. Removing the deposits corrects reduction in transmissivity of chamber components to lamp radiation and to substrate emissions, maintaining repeatability of film properties from substrate to substrate. The cleaning gas is typically a gas containing chlorine, bromine, or iodine. Gases such as $Cl_2$, $Br_2$, $I_2$, HCl, HBr, and HI are often used. When elemental halogens are used, temperature of the chamber may be held approximately constant, or increased slightly, to clean the chamber. When hydrogen halides are used, temperature of the chamber is typically increased to compensate for reduced concentration of halogen cleaning agents. Temperature of the chamber during cleaning with hydrogen halides may be increased to between about 800° C. and about 1,200° C., for example about 900° C. After cleaning from 30 seconds to 10 minutes, depending on the cleaning mode of operation, another substrate may be processed.

While the foregoing is directed to general embodiments, other and further embodiments may be devised without departing from the basic scope thereof, and the scope thereof is determined by the claims that follow.

The invention claimed is:

1. A substrate processing apparatus, comprising:
 a vacuum chamber comprising a dome and a floor;
 a substrate support disposed inside the vacuum chamber;
 a plurality of thermal lamps arranged in a lamphead and positioned proximate the floor of the vacuum chamber;
 a reflector disposed proximate the dome, the reflector and the dome together defining a thermal control space;
 a plurality of power supplies coupled to the plurality of thermal lamps; and
 a controller for adjusting the power supplies to control a temperature in the vacuum chamber.

2. The substrate processing apparatus of claim 1, further comprising one or more top thermal sensors disposed proximate the reflector, wherein the adjusting the power supplies is based on input from the one or more top thermal sensors.

3. The substrate processing apparatus of claim 2, wherein the one or more top thermal sensors are disposed in the reflector.

4. The substrate processing apparatus of claim 1, further comprising a plurality of lower thermal sensors disposed within the lamphead.

5. The substrate processing apparatus of claim 4, wherein the adjusting the power supplies is based on input from the plurality of lower thermal sensors.

6. The substrate processing apparatus of claim 5, wherein the plurality of lower thermal sensors are oriented to receive thermal radiation emitted by a substrate and transmitted by the substrate support.

7. The substrate processing apparatus of claim 6, wherein each thermal sensor in the plurality of lower thermal sensors is disposed at a different distance relative to a center of the substrate support.

8. The substrate processing apparatus of claim 7, wherein a central lower thermal sensor is disposed at a position to monitor a central zone of a substrate to be placed on the substrate support.

9. The substrate processing apparatus of claim 8, wherein at least one outer thermal sensor is disposed at a position to monitor an outer zone of a substrate to be placed on the substrate support as the substrate is rotated, wherein the outer zone is concentric with the central zone.

10. The substrate processing apparatus of claim 1, wherein the the adjusting the power supplies is based on input from one or more top thermal sensors disposed proximate the reflector and input from a plurality of lower thermal sensors disposed within the lamphead.

11. A substrate processing apparatus, comprising:
a vacuum chamber comprising a dome and a floor;
a substrate support having low thermal mass disposed inside the vacuum chamber;
a plurality of thermal lamps arranged in a lamphead and positioned proximate the floor of the vacuum chamber;
a reflector disposed proximate the dome, the reflector and the dome together defining a thermal control space;
a plurality of power supplies coupled to the thermal lamps; and
a controller for adjusting the power supplies to control a temperature in the vacuum chamber.

12. The substrate processing apparatus of claim 11, further comprising a plurality of thermal sensors disposed within the lamphead positioned to receive thermal radiation emitted by a substrate and transmitted by the substrate support.

13. The substrate processing apparatus of claim 12, wherein the substrate support comprises a disk-like member.

14. The substrate processing apparatus of claim 12, where the substrate support comprises a ring-like member.

15. The substrate processing apparatus of claim 12, wherein the substrate support comprises three or more pins.

16. A method of processing a substrate, comprising:
disposing the substrate in a chamber having a floor and a dome;
heating the substrate by transmitting radiation from a plurality of lamps through the floor;
reflecting a radiation emitted by the substrate with a reflector disposed proximate the dome, the reflector and the dome together defining a thermal control space;
depositing a layer on the substrate by flowing a precursor gas across the substrate substantially parallel to a surface of the substrate;
detecting a first temperature at a first zone of the substrate using a first sensor disposed proximate the floor;
detecting a second temperature at a second zone of the substrate using a second sensor disposed proximate the floor;
adjusting power to a first portion of the plurality of lamps based on the first temperature; and
adjusting power to a second portion of the plurality of lamps based on the second temperature.

17. The method of claim 16, further comprising:
removing the substrate from the chamber;
flowing a cleaning gas comprising chlorine, bromine, or iodine, into the chamber;
removing the cleaning gas from the chamber; and
disposing a second substrate in the chamber for processing.

18. The method of claim 17, wherein a temperature of the chamber is maintained or increased while flowing the cleaning gas into the chamber.

19. The method of claim 18, wherein the first zone is located a first radial distance from a center of the substrate, the second zone is located a second radial distance from the center of the substrate, and the first radial distance is different from the second radial distance.

20. The method of claim 19, further comprising maintaining a temperature gradient across the substrate.

* * * * *

UNITED STATES PATENT AND TRADEMARK OFFICE
CERTIFICATE OF CORRECTION

| | | |
|---|---|---|
| PATENT NO. | : 9,230,837 B2 | Page 1 of 1 |
| APPLICATION NO. | : 14/292300 | |
| DATED | : January 5, 2016 | |
| INVENTOR(S) | : Ranish et al. | |

It is certified that error appears in the above-identified patent and that said Letters Patent is hereby corrected as shown below:

In the Claims:

Column 7, Claim 10, Line 25, please delete "the" after the.

Signed and Sealed this
Twenty-sixth Day of April, 2016

Michelle K. Lee
*Director of the United States Patent and Trademark Office*